Figure 1:
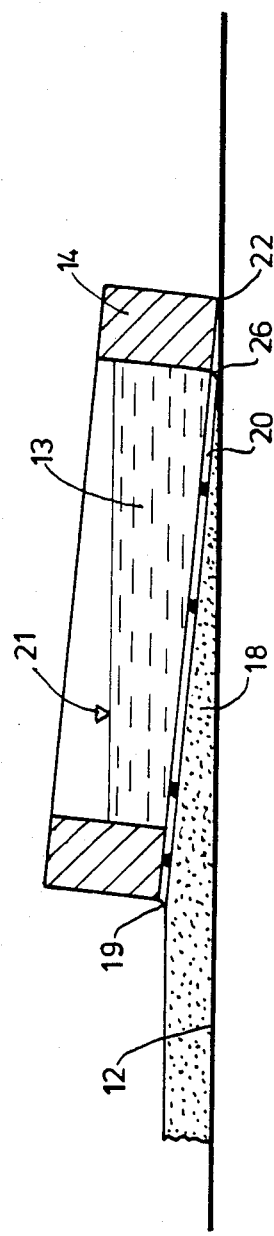

United States Patent [19]

Schwirtlich et al.

[11] Patent Number: 4,670,096
[45] Date of Patent: Jun. 2, 1987

[54] PROCESS AND APPARATUS FOR PRODUCING SEMI-CONDUCTOR FOILS

[75] Inventors: Ingo Schwirtlich; Peter Woditsch, both of Krefeld, Fed. Rep. of Germany

[73] Assignee: Bayer Aktiengesellschaft, Leverkusen, Fed. Rep. of Germany

[21] Appl. No.: 730,982

[22] Filed: May 6, 1985

[30] Foreign Application Priority Data

May 23, 1984 [DE] Fed. Rep. of Germany ....... 3419137

[51] Int. Cl.$^4$ .......................... C03B 19/02; C03B 1/02
[52] U.S. Cl. ................................... 156/608; 156/622; 156/DIG. 64; 156/DIG. 88; 164/463; 164/479
[58] Field of Search ............... 164/423, 427, 429, 463, 164/479; 264/212; 427/86; 422/246; 156/608, DIG. 64, DIG. 88, 622

[56] References Cited

U.S. PATENT DOCUMENTS

| | | | |
|---|---|---|---|
| 4,233,338 | 11/1980 | Ricard et al. | 156/622 |
| 4,323,419 | 4/1982 | Wakefield | 164/461 |
| 4,330,358 | 5/1982 | Grabmaier et al. | 156/DIG. 88 |
| 4,468,280 | 8/1984 | Bender et al. | 164/423 |
| 4,468,281 | 8/1984 | Bender et al. | 164/423 |
| 4,484,614 | 11/1984 | Maringer | 164/429 |

FOREIGN PATENT DOCUMENTS

| | | |
|---|---|---|
| 2817285 | 10/1979 | Fed. Rep. of Germany . |
| 2952620 | 7/1980 | Fed. Rep. of Germany ...... 164/423 |
| 3231326 | 2/1984 | Fed. Rep. of Germany . |

OTHER PUBLICATIONS

Patent Abstracts of Japan, vol. 7, No. 86 (C-161)[1231], 4/9/83, "Production of p-n Junction Crystal Substrate".

Primary Examiner—Nicholas P. Godici
Assistant Examiner—Richard K. Seidel
Attorney, Agent, or Firm—Sprung Horn Kramer & Woods

[57] ABSTRACT

In the production of a semi-conductor foil by solidification of a liquid semi-conductor on a horizontal support, the improvement which comprises positioning a molding body on the horizontal support, supplying the liquid semi-conductor to the molding body, and effecting relative movement between the molding body and support in a direction parallel to the support. Thereby fault-free silicon foils can readily be produced.

7 Claims, 2 Drawing Figures

PROCESS AND APPARATUS FOR PRODUCING SEMI-CONDUCTOR FOILS

This invention relates to a process for the production of semi-conductor foils by solidification of a liquid semicomductor on a horizontal support and to an apparatus for carrying out the process.

Solar cells are nowadays produced predominantly from silicon discs obtained from cast coarse crystalline silicon blocks or by sawing up mono-crystals.

Production of the crystals and the subsequent process of breaking them down form discontinuous operations which are characterized by high manufacturing costs and heavy loss of material. Particularly the wastage produced in the sawing operation, which is of the order of 50%, renders this solution uneconomic.

Strenuous attempts have therefore been made in recent years to find more economic continuously-operating processes by which silicon tapes may be produced direct from the melt.

U.S. Pat. No. 3,591,348 discloses a process in which a mono-crystalline silicon tape is produced at the upper end of a molding device forming of a slot immersed in the melt. The production rates obtainable by this proces, however, are only from 0.01 to 0.5 m/min. This rate is too low to meet the economic reuirements of a large scale technical production process.

Considerably higher production rates may be achieved in the casting process for silicon foils described in U.S. Pat. No. 4,323,419, in which the melt is applied to a fast moving metal band by extrusion. Due to the rapid solidification of the melt, however, the micro-crystalline structure obtained has such a high grain boundary density that it impairs the electrical performance data of a solar cell produced therefrom. The same applies to the process disclosed in DE-A 3,226,931, in which a net is used as carrier substance instead of the metal foil. The net, composed of graphite or graphitized quartz fibers, if transported over a cooled drum and coated with molten silicon from the lower nozzle opening of a melting vat. In this process, the net is closely integrated with the silicon tape after solidification of the molten silicon. The interactions between the net and the silicon may give rise to lattice faults which are liable to impair the electrical properties of the tape.

In applications No. DE-A 3,231,266, DE-A 3,231,327 and DE-A 3,231,268 solidification of the silicon melt in the meshes of the net is separated from the coating process proper.

According to No. EP-A 72,565, the molten silicon is applied through a slot-shaped aperture to a steeply upwardly transported substrate. This upwardly-directed process, which takes up a considerable height, as well as requiring a certain inclination from the vertical, entails high construction costs and takes up a great deal of space. In addition, solidification of the silicon must be completed within a limited time span.

The process also has the further disadvantage that, at very high pull rates, the forces of acceleration acting on a unit volume of melt during the coating process may exceed the surface tension of the melt and the forces of adhesion between the melt and the substrate or the melt and the layer of slag applied to the substrate, with the result that the film of melt is liable to break.

To produce tapes of satisfactory quality and hence electrical properties, it is essential to achieve as low as possible a concentration of crystal faults, such as grain boundaries, stacking faults, dislocations and point defects. The formation of these lattice faults is substantially influenced by the process of solidification, i.e. the speed and direction of the boundary surface between the solid and liquid phase.

It is an object of the present invention to provide a process which enables semi-conductor tapes to be produced from the melt at high speeds and hence economically. It is aimed to achieve large crystal grains grown in columnar formation with a low concentration of faults.

This problem may surprisingly be solved by a horizontally-oriented mode of operation and the formation of a geometrically predetermined phase interface with the aid of a molding body. This molding body serves to apply the silicon melt to a moving support material.

The present invention thus relates to a process for the production of semi-conductor foils by solidfication of a liquid semiconductor on a horizontal support, characterized in that the liquid semi-conductor is applied by means of a molding body to the horizontal support which is moved parallel to the support.

Figure 2:
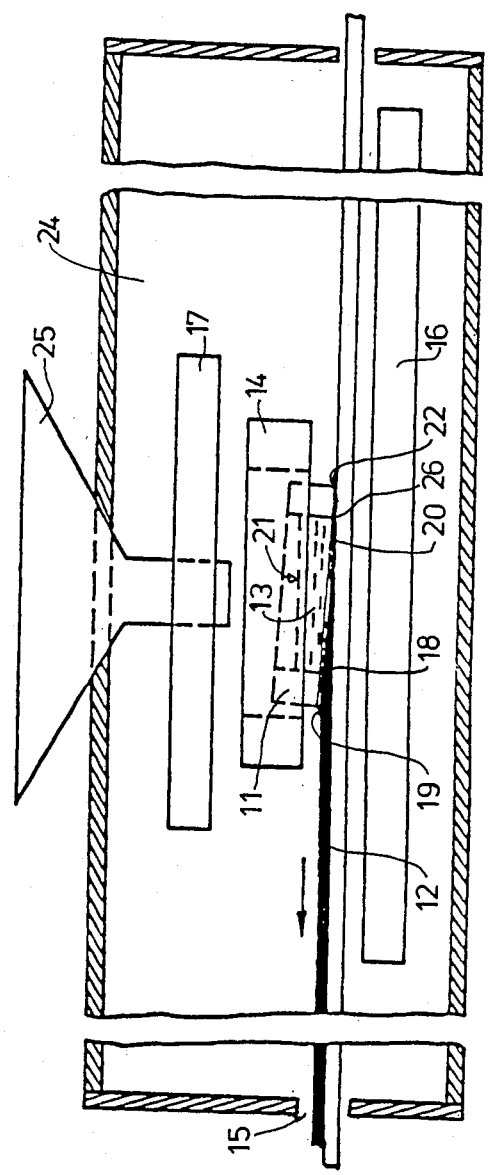
Figure 3:
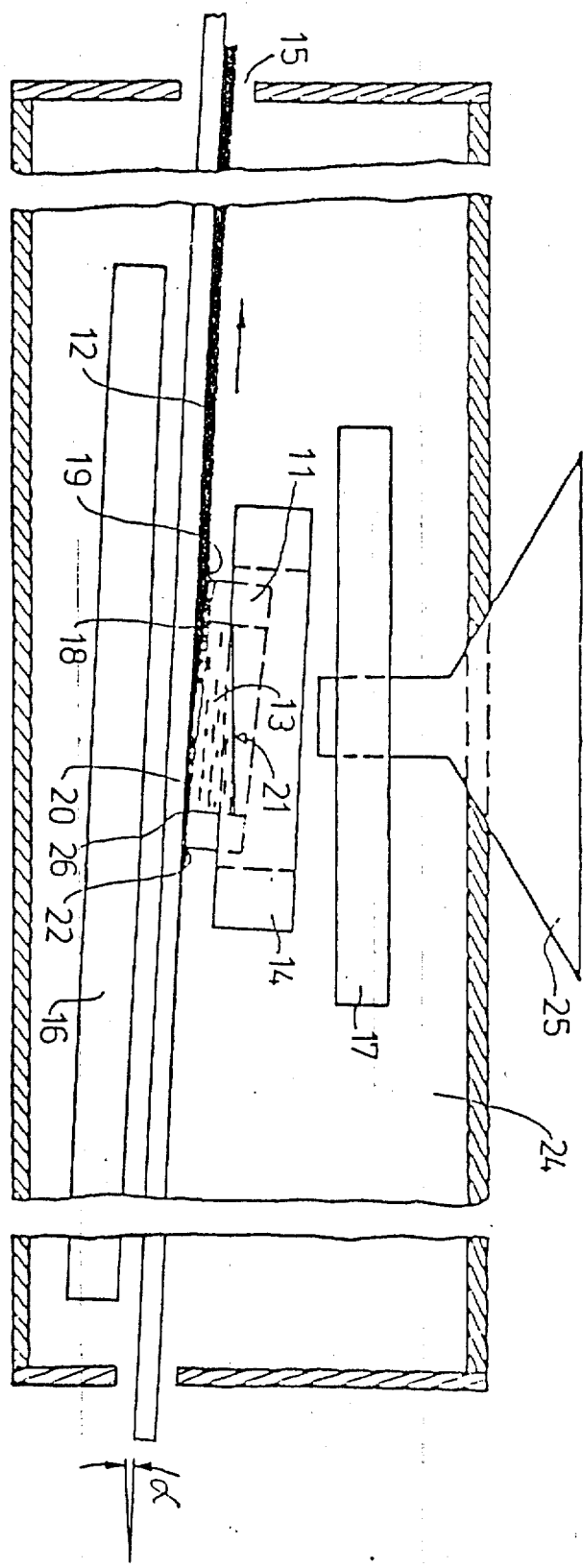

The invention will be further described with reference to the accompanying drawings, wherein:

FIG. 1 is a schematic sectional view through a part of an apparatus for carrying out the novel process, on an enlarged scale relative to FIG. 2, FIG. 2 is a sectional view through the entire apparatus, and FIG. 3 is a sectional view through the entire apparatus wherein the support 15 is tilted at an angle.

Referring now more particularly to the drawings the dimensions of the molding body determine the size of the interface between the liquid and the already solidified phase, as may be seen from accompanying FIG. 1. Due to the size of this interface, considerably more time is available for the growth in thickness of the foil in this process according to the present invention than in other rapid drawing processes.

In the horizontal method of foil drawing according to the present invention, therefore, the growth wedge may be increased in length by increasing the effective length of the molding body.

This in turn permits crystallization velocities to be lower by more than a factor of 100 without any reduction in the drawing speeds.

The process according to the present invention is preferably carried out in such a manner that the velocity of the movement is from 1 to 20 m/min.

This extremely economical process may be carried out, for example, in the apparatus illustrated in accompanying FIG. 2.

This consists of a molding body (11) into which the semi-conductor melt (13) is introduced from a funnel (25). The molding body (11) is held in a frame (14) which permits free vertical movement, as well as slight tilting movements of the molding body. The freedom of movement is limited in the downward direction by the substrate (12) or the solid semi-conductor (18) of the growth wedge. A small meniscus (19) forms at the exit of the solidified semi-conductor from the molding body. That edge of the molding body (11) which forms the front edge in the direction of pull therefore floats on a liquid-film (20) above the growth wedge (18). The rear end of the molding body (11), viewed in the direction of pull, lies on the support (12) at the point (22). Another meniscus (26) forms at the beginning of the growth wedge (18), whereby the outflow of silicon is prevented.

The pressure conditions at the lower edge of the molding body may be controlled by the specific gravity of this body and its volume together with the height (21) of the melt. The forces occurring in the melt must not exceed the surface tension if outflow from the lower edge of the molding body is to be prevented.

In one advantageous embodiment of the process according to the present invention, the temperature of the molding body and of the support may be regulated.

Heating means (17) situated above the molding body (11) and holder (14) in accompanying FIG. 2 serve to keep the molten semi-conductor material in the molding body in a liquid state. The heating means (17) may, of course, be provided as a ring heating device in the upper region of the holder (14) or of the molding body. The heating means (16) serve to adjust the temperature of the support (12).

When the molten semi-conductor material makes contact with the material of the support, a thin layer of solidified semi-conductor material will form, provided the temperature of the substrate is below the melting point of the semi-conductor. This solidified layer will continue to grow by removal of heat from the undersurface of the support during the forward movement under the molding body so long as contact with the liquid phase is maintained. At the state of dynamic equilibrium, a growth wedge corresponding in length to the effective length of the molding body will be formed.

This growth process may be positively influenced by adjusting a temperature gradient between the molding body and the support. It is particularly advantageous to provide a smaller temperature gradient on the side of the molding body facing the direction of pull than on the opposite side.

Other molding bodies are, of course, also suitable for producing the foil, for example, a rigidly mounted body having an opening on the side facing the direction of pull corresponding to the thickness of the film.

It is immaterial for the process according to the present invention whether the substrate (12) is pulled forwards from under the molding body (11) or the molding body is pulled over the substrate. Moreover, this relative displacement need not be restricted to the horizontal plane. It may still be carried out satisfactorily when the support is inclined to the horizontal at an angle of up to 35 30°. The maximum angle is determined by the ratio of the hydrostatic pressure to the surface tension of the melt at the lower edge of the molding body, by its wetting characteristics, the direction of pull and the relative velocity of the molding body to the support.

The process according to the present invention is applicable to semi-conductors in general and is particularly suitable in its application to silicon as semi-conductor. This may be used in any degree of purity and doped material may, of course, also be used.

Multiple foils may also be produced by the process according to the present invention, in which case a fresh layer is applied to a foil already produced so that the completed foil serves as support. These multiple foils may contain differently doped layers if differently doped semi-conductors are used. The width of the foils produced by the process is limited only by the width of the molding body.

The present invention also relates to the apparatus described above for carrying out the process. Its geometry is characterized by the relationship:

$$a = \frac{V_Z \cdot d}{V_K} + b$$

wherein b represents the wall thickness of the molding body; a represents the length of the molding body; $V_Z/V_K$ represents the ratio of the pulling rate $V_Z$ to the speed of crystallization $V_K$; and d represents the foil thickness.

The materials used in the process according to the present invention and for the apparatus are not subject to restrictions provided they are not attacked by the semi-conductor under the conditions to be employed. The support, for example, may consist of plates of graphite of differing densities or of a density about 1.75 g/cm$^3$. Further improvements may be obtained by applying suitable coatings, for example of silicon nitrides or silicon carbides; and by using a combination of materials of this type, those skilled in the art being above to adjust the wetting conditions to produce optimum foil surfaces. Adherence of the foils and wetting of the substrate may be suitably adjusted to each other so that smooth surfaces are obtained and at the same time the foil is easily separated from the substrate. Other support plates of silicon carbide and silicon nitride or oxidic ceramics are also suitable and interaction between the support material and the liquid semi-conductor may to a large extent be prevented by keeping the substrate at low temperatures of from 800° to 1200° C. or by applying coatings. The coating methods mentioned above may also be used for these substrates.

The molding bodies may consist of silicon carbide, silicon nitride or graphite, provided these materials are not destroyed by the liquid semi-conductor, i.e. are neither attacked chemically or damaged mechanically. The molding bodies may be coated or they may be impregnated with liquid and subsequently pyrolyzed.

An apparatus in which the molding body and/or the support consists of high density graphite, $Si_3N_4$, SiC-coated graphite, ceramics or silicon is thus preferred.

The following examples serve to illustrate the process and apparatus according to the present invention without limiting the inventive concept.

EXAMPLE 1

The molding body used for applying the silicon to the carrier material consisted of a graphite frame (11) having an internal width of 50 mm × 40 mm and a height of 15 mm. Its wall thickness was 10 mm. This body was placed directly on a graphite plate (12) used as substrate. Another graphite frame (14) held the molding body (11) so that it could only move in an upward direction. The frame (14) was designed so that it also served as connecting element between the two side walls (24). Resistance heaters (16, 17) having a large surface area were provided, one below the substrate plate (12) and one above the frame (14). These heaters regulated the supply of heat to the silicon melt (13) and to the support plate (12). The silicon was melted in a tilting crucible (not shown) arranged on the outside and poured into the molding body (11), which was preheated to from 1380° to 1420° C., through the quartz funnel (25) and an opening in the heater (17). At the same time, the support material (12) was pulled forwards under the molding body at a speed of 1.2 m/min. A band of solidified silicon about 50 mm in width formed when the substrate was at a temperature of from 1000° to 1200° C. During the subsequent cooling process, this band became detached from the substrate plate without external means so that it could be removed when cold. The thickness of the band was about 0.5 mm, while its length, due to the dimensions of the apparatus, was about 150 mm.

EXAMPLE 2

The procedure was the same as described in Example 1, but using a frame (14) of silicon nitride and a support material in the form of a substrate plate of silicon carbide which had been coated with silicon nitride/oxide. A silicon film 0.4 mm in thickness produced on a substrate having a length of about 500 mm could easily be separated from the support material. The silicon film obtained had a length of 300 mm.

It will be understood that the specification and examples are illustrative but not limitative of the present invention and that other embodiments within the spirit and scope of the invention will suggest themselves to those skilled in the art.

We claim:

1. In the production of a semi-conductor foil by solidification of a liquid semi-conductor on a horizontal support, the improvement which comprises positioning a molding body on the horizontal support, supplying the liquid semi-conductor to the molding body, and effecting relative movement between the molding body and support in a direction parallel to the support, the wall thickness of the molding body, b, being related to the length of the molding body, a, by the equation:

$$a = \frac{V_Z \cdot d}{V_K} + b$$

wherein $V_Z/V_K$ is the ratio of the velocity of movement $V_Z$ to the velocity of crystallization $V_K$; and d is the thickness of the foil.

2. A process according to claim 1, wherein the molding body is vertically displaceable.

3. A process according to claim 1, wherein the speed of the movement is from 1 to 20 m/min.

4. A process according to claim 1, wherein the temperature of at least one of the molding body and the support is adjusted to establish a temperature gradient between the molding body and the support.

5. A process according to claim 1, wherein a smaller temperature gradient is established on the leading face of the molding body than on the trailing face.

6. A process according to claim 1, wherein the support is inclined to the horizontal at an angle of up to ±30°.

7. A process according to claim 1, wherein the semiconductor is silicon.

* * * * *

UNITED STATES PATENT AND TRADEMARK OFFICE
CERTIFICATE OF CORRECTION

PATENT NO. : 4,670,096

DATED : June 2, 1987

INVENTOR(S) : Ingo Schwirtlich, et al.

It is certified that error appears in the above-identified patent and that said Letters Patent is hereby corrected as shown below:

| | |
|---|---|
| In the Drawings | Insert --Fig. 3-- per attached showing support 15 tilted at an angle |
| Col. 3, line 48 | Delete "35 30°" and substitute -- ±30°-- |
| Col. 4, line 6 | Delete "a" and substitute --a-- |
| Col. 4, line 19 | Delete "above" and substitute --able-- |

Signed and Sealed this

Twenty-ninth Day of March, 1988

Attest:

DONALD J. QUIGG

Attesting Officer

Commissioner of Patents and Trademarks $\alpha \leq \pm 30°$